US006567309B2

(12) United States Patent
Tanzawa

(10) Patent No.: US 6,567,309 B2
(45) Date of Patent: *May 20, 2003

(54) SEMICONDUCTOR DEVICE

(75) Inventor: Toru Tanzawa, Ebina (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/180,083

(22) Filed: Jun. 27, 2002

(65) Prior Publication Data

US 2002/0163836 A1 Nov. 7, 2002

Related U.S. Application Data

(63) Continuation of application No. 09/957,029, filed on Sep. 21, 2001, now Pat. No. 6,438,034.

(30) Foreign Application Priority Data

Sep. 22, 2000 (JP) ........................................ 2000-288329

(51) Int. Cl.[7] ............................................... G11C 16/04
(52) U.S. Cl. ........................... 365/185.18; 365/185.17; 365/189.07
(58) Field of Search ....................... 365/185.18, 185.17, 365/189.07, 233

(56) References Cited

U.S. PATENT DOCUMENTS 5,483,486 A    1/1996  Javanifard et al. .......... 327/536
5,495,453 A    2/1996  Wojciechowski et al. .................... 365/185.18
5,969,988 A  * 10/1999 Tanzawa et al. ........ 365/185.18

FOREIGN PATENT DOCUMENTS

JP         11-25673       6/1997
JP        10-302492      11/1998

OTHER PUBLICATIONS

J. Javanifard et al., "A Smart Auto–Configuring Selectable–Voltage 16Mb Flash Memory", 14th Annual IEEE Nonvolatile Semiconductor Memory Workshop, vol. 5.1, Aug. 1994.

* cited by examiner

Primary Examiner—Huan Hoang
(74) Attorney, Agent, or Firm—Banner & Witcoff, Ltd.

(57) ABSTRACT

A boosted voltage generation circuit stops the voltage boosting operation immediately after the oscillation activation signal of the oscillator generating a plurality of phase shifted clock signals has been inactivated so as to suppress the increase in the output current of the voltage boosting circuit and dependence of the boosted voltage on the power supply voltage. The boost voltage generation circuit comprises a clock signal generating circuit generating a plurality of phase shifted clock signals, a voltage boosting circuit supplied with a plurality of boost-driving clock signals for generating a boosted voltage higher than the power supply voltage, and a clock signal control circuit serving to transfer the clock output of the clock signal generating circuit when the detected signal has a first logic state, and serving to hold the logic state of the voltage boosting clock signal when the detected signal has a second logic state.

38 Claims, 11 Drawing Sheets

PELATED ART

PELATED ART

PELATED ART

|    | Read | Program         | Erase    |
|----|------|-----------------|----------|
| Vg | 5V   | 9V              | -7V      |
| Vd | 1V   | 5V("1") 0V("0") | Floating |
| Vs | 0V   | 0V              | 10V      |

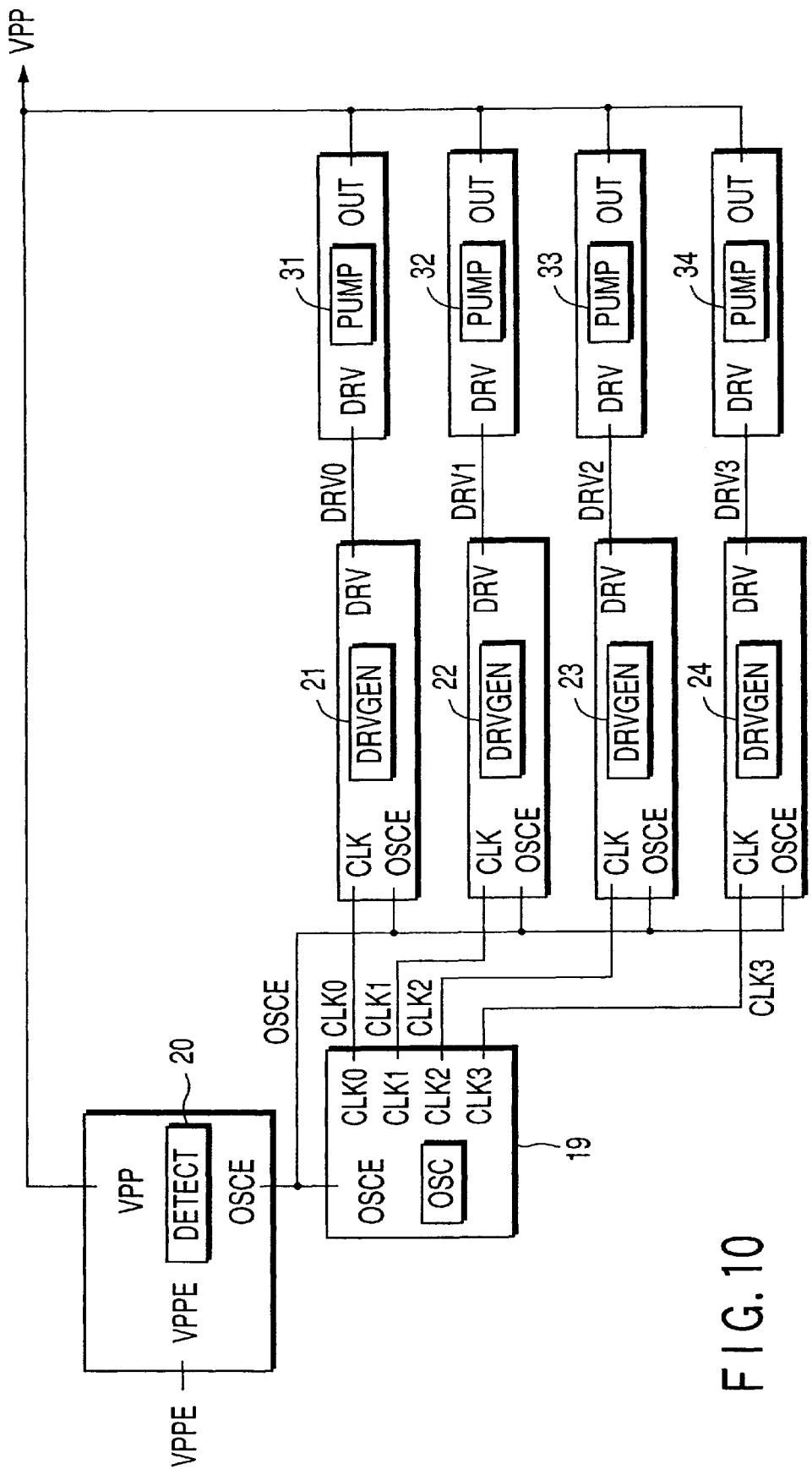
F I G. 10

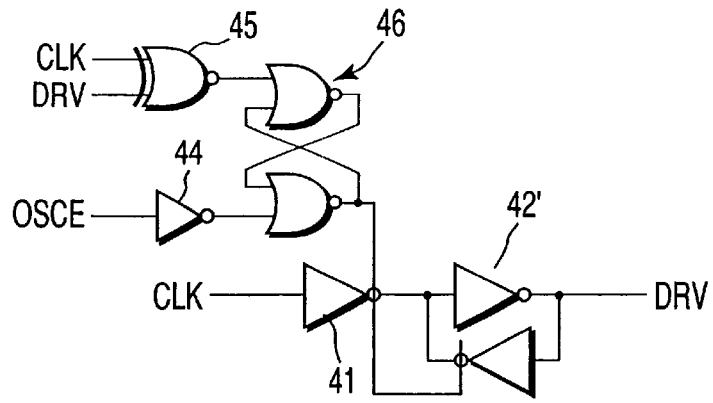
F I G. 12D
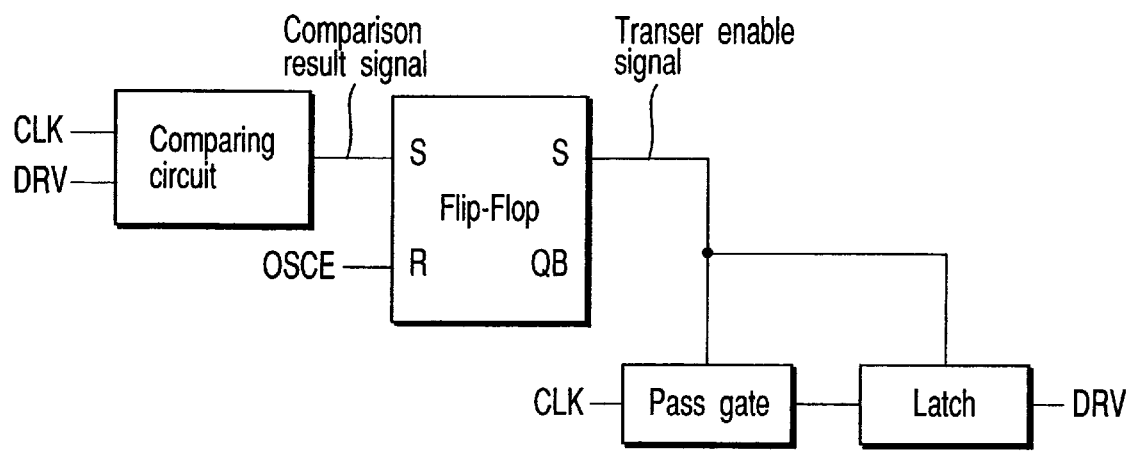
F I G. 12E
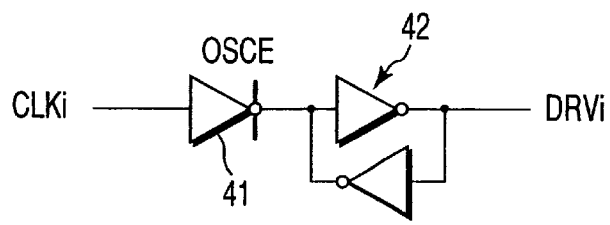
F I G. 15

SEMICONDUCTOR DEVICE

This application is a Continuation of U.S. application Ser. No. 09/957,029 filed Sep. 21, 2001 now U.S. Pat. No. 6,438,034.

CROSS-REFERENCE TO RELATED APPLICATIONS

This application is based upon and claims the benefit of priority from the prior Japanese Patent Application No. 2000-288329, filed Sep. 22, 2000, the entire contents of which are incorporated herein by reference.

BACKGROUND OF THE INVENTION

1. Field of the Invention

The present invention relates to a semiconductor device comprising a voltage boosting circuit for boosting the power supply voltage, particularly, to a semiconductor device comprising a voltage boosting circuit that is boost-driven by a plurality of phase shifted clock signals generated from an oscillation circuit, the semiconductor device being used in, for example, a semiconductor memory device in which a high voltage used in erasing, writing and reading data in and from the memory cell is generated from a voltage boosting circuit.

2. Description of the Related Art

FIG. 1 is a cross sectional view showing the construction of one memory cell included in a flash memory, which is one of semiconductor memory devices. As shown in FIG. 1, an N-well 2 is formed in a P-type semiconductor substrate 1. Further, a P-well 3 is formed in the N-well 2. Source and drain regions 4, 5 each consisting of an N$^+$ region are formed apart from each other in the P-well 3. A floating gate 6 is formed on the channel region between the source and drain regions 4 and 5 with an insulating film (not shown) interposed between the floating gate 6 and the channel region. Further, a control gate 7 is formed on the floating gate 6 with an insulating film (not shown) interposed therebetween.

A contact region 8 consisting of a P$^+$ region is formed on the P-type semiconductor substrate 1. A contact region 9 consisting of an N$^+$ region is formed in the N-well 2. Further, a contact region 10 consisting of a P$^+$ region is formed in the P-well 3.

During the operation, a gate voltage Vg is supplied to the control gate 7 of the memory cell, a drain voltage Vd is supplied to the drain region 5, and a source voltage Vs is supplied to the source region 4. Also, a voltage equal to the source voltage Vs is supplied to each of the contact regions 9 and 10, and a ground voltage of 0V is supplied to the contact region 8.

The memory cell shown in FIG. 1 stores "1" level and "0" level of the data depending on the amount of electrons stored in the floating gate 6. Also, the threshold voltage as viewed from the control gate 7 is changed in accordance with the level of the stored data. A memory cell array is formed by arranging a plurality of memory cells of the particular construction.

FIG. 2 exemplifies a circuit of a memory cell array of a NOR type flash memory. A plurality of memory cells MC are arranged in rows and columns. The control gates of the memory cells MC arranged in the same row are commonly connected to the corresponding single word line selected from a plurality of word lines WL0 to WLn. Also, the drain regions of the memory cells MC arranged in the same column are commonly connected to the corresponding single bit line selected from a plurality of bit lines BL0 to BLm. In general, the memory cell is divided into a plurality of blocks, and the source regions of the memory cells MC in the same block are commonly connected to the source line of the corresponding block selected from a plurality of source lines SLi.

FIG. 3 is a graph showing the relationship between the gate voltage supplied to the control gate of the memory cell during operation of the flash memory shown in FIG. 2 and the drain current flowing into the drain region of the memory cell during operation of the flash memory shown in FIG. 2. In this case, the state that a relatively large amount of electrons are stored in the floating gate, i.e., the state that the threshold voltage Vth of the memory cell is high, represents "0" data, and the memory cell storing the "0" data is called "0" cell. On the other hand, the state that a relatively small amount of electrons are stored in the floating gate, i.e., the state that the threshold voltage Vth is low, represents "1" data, and the memory cell storing the "1" data is called "1" cell.

FIG. 4 exemplifies the values (bias conditions) of the gate voltage Vg, the drain voltage Vd and the source voltage Vs supplied to the memory cell during operation, i.e., during reading, writing and erasing of data, of the flash memory shown in FIG. 2.

When data is read, the gate voltage Vg, the drain voltage Vd and the source voltage Vs are set at 5V, 1V and 0V, respectively. During the data writing (during the programming), the gate voltage Vg and the source voltage Vs are set at 9V and 0V, respectively. On the other hand, the drain voltage Vd is set at 5V when it comes to the memory cell in which the "0" data is written, and is set at 0V when it comes to the other memory cell, i.e., the memory cell in which the original "1" data is stored. Further, in the erasing step, the gate voltage Vg and the source voltage Vs are set at −7V and 10V, respectively, and the drain voltage Vd is put in the floating state.

The reading of data is judged depending on the state as to whether or not a cell current flows at the time when a gate voltage Vread (5V in this case) is supplied to the control gate under the state that a predetermined voltage (1V in this case) is supplied to the drain region. The judgment is performed by the comparison with the reference current Iref flowing into the reference cell, the comparison being performed by a sense amplifier (not shown).

The erasure is collectively performed in a plurality of memory cells sharing the P-well 3 shown in FIG. 1. In the erasing step, electrons flow from the floating gate 6 into the P-well region 3 by the Fowler-Nordheim (F•N) tunneling phenomenon, with the result that all the memory cells to be erased are put in the conditions of "1" cell.

The writing is performed for each memory cell. The bit line of the memory cell in which the "0" data is written is biased to 5V so as to inject the high energy electrons generated by the channel hot electron phenomenon into the floating gate 6. In this case, the bit line of the "1" cell, in which the original "1" data is desired to be maintained, is set at 0V. As a result, the electron injection into the floating gate 6 does not take place in the memory cell in which the data is not written, with the result that the threshold voltage Vth is not changed.

Also, a write verify operation and an erase verify operation are performed in the flash memory in the writing step and the erasing step in order to confirm the degree of writing and erasing. In the write verify operation, the voltage of the control gate 7 is set at a high voltage Vpv, e.g., 7V, compared with the voltage Vread in the reading step (5V in this case), so as to perform the "0" read operation. The write operation and the write verify operation are alternately performed repeatedly, and the write operation is finished when all the data of the memory cells in which the data is written have become "0".

In the erasing step, the voltage of the control gate 7 is set at a voltage Vev, e.g., 3.5V, which is lower than the voltage Vread in the reading step, so as to perform the "1" read operation. The erase operation and the erase verify operation are alternately performed repeatedly, and the erase operation is finished when all the data of the memory cells to be erased have become "1". As a result, the cell current Icell is secured sufficiently.

As described above, the voltage supplied to the control gate of the memory cell is changed variously in accordance with the operation mode. For example, the voltage noted above is changed to 9V, 7V, 5V, and 3.5V. The voltages of 9V, 7V and 5V are higher than the power supply voltage supplied from the outside.

In order to form various voltages such as 9V, 7V and 5V, which are higher than the power supply voltage supplied from the outside, a required number of boosting circuits for boosting the power supply voltage are arranged, and the outputs of these plural boosting circuits are selected appropriately by a switch so as to be supplied to the control gate of the memory cell.

A boosting circuit for boosting the power supply voltage is used in a memory for reading and rewriting the data by forming various voltages higher than the power supply voltage supplied from the outside within the chip such as the flash memory described above.

FIG. 5 exemplifies the construction of the system of the conventional boost voltage generation circuit, and FIG. 6 shows the wave forms of the main signals or voltage for describing the operation of the boost voltage generation circuit shown in FIG. 5.

The construction of the boost voltage generating circuit shown in FIG. 5 is known to the art. Specifically, as shown in FIG. 5, the boost voltage generating circuit comprises an oscillation circuit (OSC) 11, a plurality of boost circuits, e.g., four boosting circuits (PUMP) 12 to 15 each using a charge pump circuit, and a voltage detection circuit (DETECT) 16, which are electrically connected to each other.

The oscillation circuit 11 is formed of, for example, a ring oscillation circuit constructed as shown in FIG. 7. The oscillation/oscillation-stop of the oscillation circuit 11 is controlled in accordance with the logic level of the input of the oscillation activation signal (OSCE) such that the oscillation circuit 11 is oscillated during the "H" period of the OSCE so as to form four phase shifted clock signals CLK0 to CLK3, which are supplied to the boosting circuits 12 to 15.

As shown in, for example, FIG. 8, each of the boosting circuits 12 to 15 comprises two systems of a charge pump circuit in which a plurality of sets of an NMOS transistor Q of an I-type (intrinsic type: Vth being close to 0V) and a capacitor C are connected to each other, and the output nodes of these two systems of the charge pump circuits are connected to each other. In this case, a driving clock DRV input is supplied to one system of the charge pump circuit through an inverter IV1 so as to boost-drive the particular system of the charge pump circuit, with the result that a voltage formed by boosting the power supply voltage Vcc is outputted to the output node OUT. On the other hand, a driving clock DRV input is supplied to the other system of the charge pump circuit through two stage inverters IC2, IV3 so as to boost-drive the other system of the charge pump circuit, with the result that a voltage formed by boosting the power supply voltage is outputted to the output node OUT.

The voltage detection circuit 16 comprises a level shift circuit 17, a voltage dividing resistor circuit 18, and a voltage comparing circuit 100, which are electrically connected to each other, as shown in, for example, FIG. 9. The voltage detection circuit 16 of the particular construction detects whether the dividing voltage Vdiv of the boosted voltage VPP is higher or lower than the reference voltage Vref during the "H" period of the voltage boost activation signal (VPPE) so as to set the oscillation activation signal OSCE output at "L" or "H" in accordance with the result of the detection.

The level shift circuit 17 comprises PMOS transistors QP1, QP2 having the sources connected to the boosted voltage VPP, NMOS transistors QN1, QN2 connected between the drains of the transistors QP1, QP2 and the ground node, an inverter IV4 supplied with the voltage boost activation signal VPPE and inverting the supplied voltage boost activation signal VPPE so as to supply the inverted signal to the gate of the transistor QN1, and an inverter IV5 for inverting the output of the inverter IV4 so as to supply the inverted signal to the gate of the transistor QN2.

The voltage dividing resistor circuit 18 comprises a PMOS transistor QP3 having the source connected to the boosted voltage VPP and supplying the output of the level shift circuit 17 to the gate, voltage dividing two resistors R1, R2 connected in series between the drain of the transistor QP3 and the ground node, and an NMOS transistor QN3 for the activation control for supplying the voltage boost activation signal VPPE to the gate.

The voltage comparing circuit 100 compares the divided voltage Vd divided by the resistors R1, R2 of the voltage dividing resistor circuit 18 with the reference voltage Vref so as to generate the oscillation activation signal OSCE.

The operation of the boost voltage generating circuit of the construction described above will now be described.

If the boost activation signal VPPE input becomes "H" in the voltage detection circuit 16, the output of the inverter IV4 becomes "L", the output of the inverter IV5 becomes "H", and the output of the level shift circuit 17 becomes "L". As a result, the PMOS transistor QP3 is turned on, the boost voltage VPP is divided by the two resistors R1, R2, and the divided voltage Vdiv is compared with the reference voltage Vref by the voltage comparing circuit 100. Since the value of the boost voltage VPP is low immediately after operation of the boosting circuits 12 to 15, the relationship of Vref>Vdiv is established so as to allow the oscillation activation signal OSCE, which is the output of the voltage comparing circuit 100, to become "H".

If the oscillation activation signal OSCE becomes "H", the oscillation circuit 11 performs the oscillating operation so as to form phase shifted clock signals CLK0 to CLK3. The clock signal CLK0 to CLK3 thus formed are supplied as the driving clock DRV to the four voltage boosting circuits 12 to 15 to allow these voltage boosting circuits 12 to 15 to perform the voltage boosting operation, and the voltages of the output nodes of these voltage boosting circuits 12 to 15 are combined so as to form the boosted voltage VPP. In this case, since the voltage boosting operations of these four voltage boosting circuits 12 to 15 are controlled by the phase shifted clock signals CLK0 to CLK3, it is possible to suppress the peak current of the entire system.

If the boosted voltage VPP is inputted and the time when the boosted voltage VPP is rendered higher than the reference value during the period "H" of the boost activation signal VPPE (Vref<Vdiv) is detected, the voltage detection circuit 16 sets the oscillation activation signal OSCE at "L", stops the oscillation of the ring oscillation circuit 11 and stops the voltage boosting operation of the voltage boosting circuits 12 to 15.

If the boosted voltage VPP is rendered lower than the reference value under this state, the oscillation activation signal OSCE is set again at "H" and the oscillating operation is started again so as to start again the charge transfer operation in the voltage boosting circuits 12 to 15. The particular operation is repeated during the period "H" of the voltage boost activation signal VPPE so as to output the boosted voltage VPP.

However, in the conventional ring oscillation circuit 11 shown in FIG. 7, the clock signals CLK0 to CLK3 are not stopped immediately after the oscillation activation signal OSCE is set at "L", and the ring oscillation circuit 11 is stopped after operated until the clock signal CLK3 is outputted. Therefore, even if the reference value of the boosted voltage VPP is set at VPP2 as shown in FIG. 6, the clock signals CLK0 to CLK3 continue to be generated even after the level of the reference value VPP2 is detected by the voltage detection circuit 16. It follows that the boosted voltage VPP is actually boosted to the level of the reference-over value VPP1 (>VPP2).

In this case, the output current of the voltage boosting circuits 12 to 15 during the one clock operation is increased with increase in the power supply voltage Vcc of the voltage boosting circuits 12 to 15. In other words, the level of the reference-over value VPP1 is dependent on the power supply voltage Vcc such that the level of VPP1 is increased with increase in the power supply voltage Vcc. On the other hand, it is desirable for the boosted voltage VPP to be low in its dependence on the power supply voltage Vcc. Therefore, the dependence of the boosted voltage VPP on the power supply voltage Vcc is of high importance in, particularly, guaranteeing the operation over a wide range of the power supply voltage Vcc.

As described above, the conventional voltage boosting circuit is driven by a plurality of phase shifted clock signals generated during the period when the oscillation circuit is activated. The conventional voltage boosting circuit of the particular construction continues to perform its voltage boosting operation for some period, which is derived from the inputting of the clock signal, even after the voltage detection circuit detects that the boosted voltage reaches the reference value so as to inactivate the oscillation activation signal. As a result, the output current of the voltage boosting circuit is increased so as to give rise to the problem that the dependence of the boosted voltage VPP on the power supply voltage Vcc is increased.

BRIEF SUMMARY OF THE INVENTION

According to one embodiment of the present invention, there is provided a semiconductor device, comprising an oscillator configured to output a plurality of phase shifted clocks; a voltage boosting circuit configured to input a plurality of driving clocks and outputting a boosted voltage higher than a power supply voltage; a voltage detection circuit configured to detect whether the boosted voltage is higher than a predetermined voltage or not and to output a detection signal, wherein the detection signal is in a first logic state when the boosted voltage is lower than the predetermined voltage and the detection signal is in a second logic state when the boosted voltage is higher than the predetermined voltage; and a clock signal control circuit configured to input a plurality of the phase shifted clocks and the detection signal, and to output a plurality of the driving clocks, wherein the clock signal control circuit transfers a plurality of the phase shifted clocks to output a plurality of the driving clocks when the detection signal is in the first logic state, the clock signal control circuit stops transferring a plurality of the phase shifted clocks when the detection signal changes from the first logic state to the second logic state, the clock signal control circuit holds the first and second logic states of a plurality of the driving clocks when the detection signal is in the second logic state, and the clock signal control circuit restarts transferring one of a plurality of the phase shifted clocks to output the corresponding one of the plurality of driving clocks when the logic state of one of a plurality of the phase shifted clocks is identical to the first logic state or the second logic state of the corresponding one of a plurality of the driving clocks after the detection signal changes from the second logic state to the first logic state.

BRIEF DESCRIPTION OF THE SEVERAL VIEWS OF THE DRAWING

FIG. 10 is a block diagram showing the system construction of the boost voltage generating circuit of a semiconductor memory according to a first embodiment of the present invention;

FIG. 12D shows still another example of the circuit construction of one of the clock signal control circuits shown in FIG. 10;

FIG. 12E exemplifies another block diagram of one of the clock signal control circuits shown in FIG. 10;

FIG. 15 exemplifies the circuit construction of one of the clock signal control circuits shown in FIG. 13.

DETAILED DESCRIPTION OF THE INVENTION

Some embodiments of the present invention will now be described with reference to the accompanying drawings.

<First Embodiment>

Figure 11:
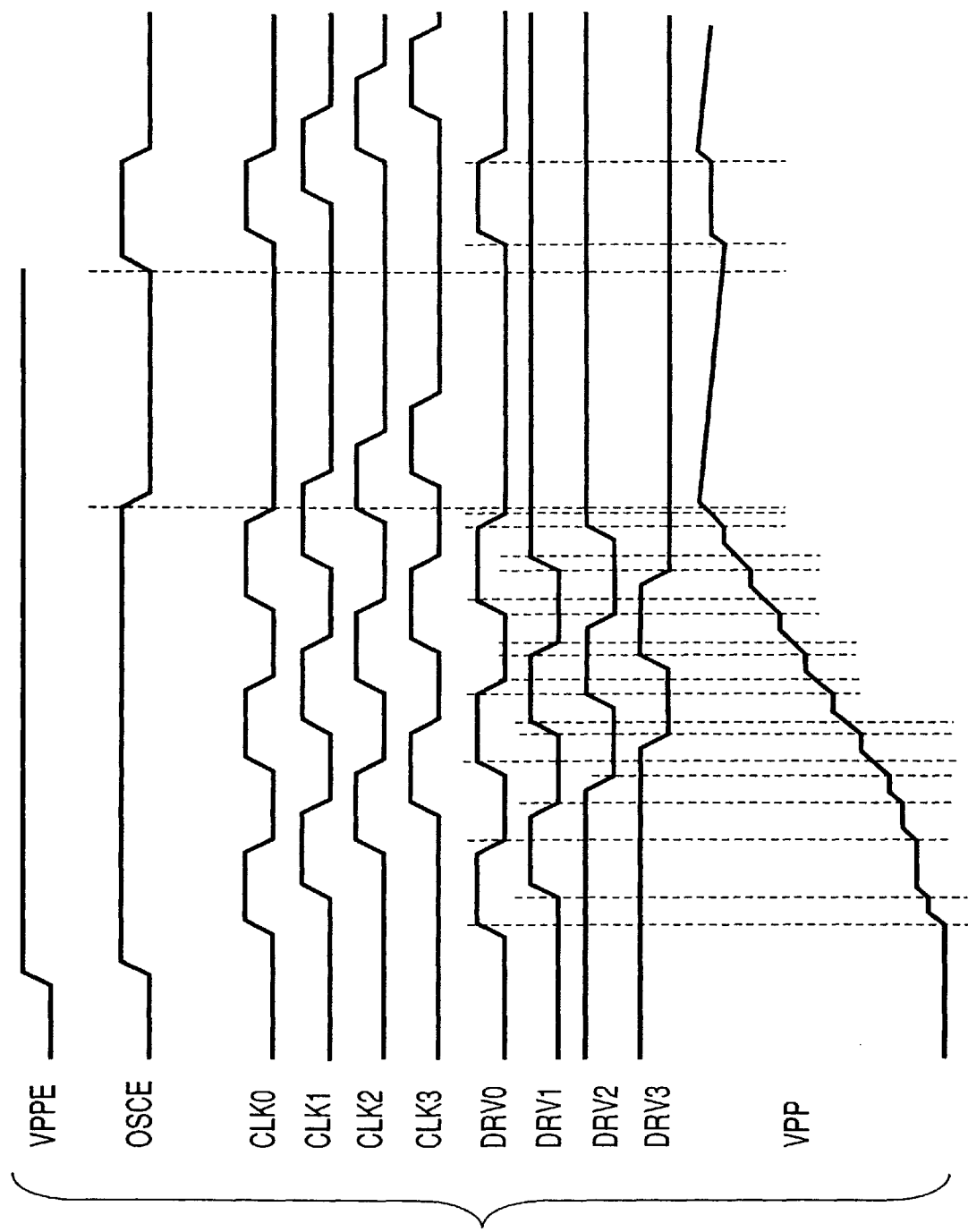
FIG. 11 shows the wave forms of the main signals and voltages for describing the operation of the circuit shown in FIG. 10.

FIG. 10 shows the system construction of the boost voltage generating circuit of a semiconductor memory according to a first embodiment of the present invention, and FIG. 11 shows the wave forms of the main signals and voltages for describing the operation of the circuit shown in FIG. 10.

Figure 7:
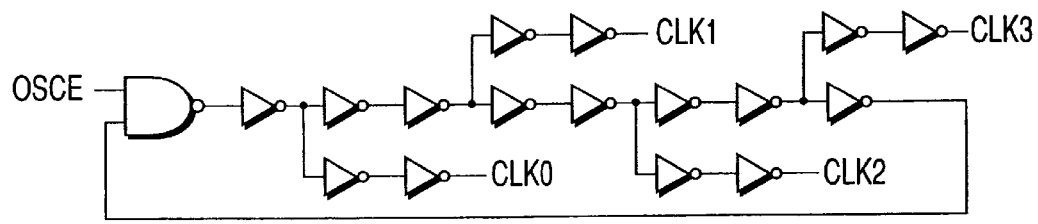
FIG. 7 exemplifies a construction of the oscillator circuit included in the circuit shown in FIG. 5.

As shown in FIG. 10, the boost voltage generating circuit comprises an oscillation circuit (OSC) 19. The oscillation circuit OSC 19 is operated during the period "H" of the oscillation activation signal OSCE so as to form, for example, four phase-shifted clock signals CLKi (i=0 to 3) and is formed of a ring oscillation circuit constructed similar to the ring oscillation circuit 11 described previously with reference to, for example, FIGS. 5 and 7.

The boost voltage generating circuit also comprises four clock signal control circuits (DRVGEN) 21 to 24. These clock signal control circuits DRVGEN 21 to 24 are commonly supplied with the oscillation activation signal OSCE together with the corresponding clock signals CLKi so as to form four boost-driving clock signals DRVi (i=0 to 3).

The boost voltage generating circuit also comprises four voltage boosting circuits (PUMP) 31 to 34. These voltage boosting circuits PUMP 31 to 34 are supplied with the boost-driving clock signals DRVi (i=0 to 3) so as to perform the voltage boosting operation and output the voltage formed by boosting the power supply voltage Vcc to the output nodes OUT. The voltages of the output nodes OUT are combined so as to form the boosted voltage VPP. These voltage boosting circuits PUMP 31 to 34 are constructed similar to the voltage boosting circuits 12 to 15 described previously with reference to, for example, FIGS. 5 and 8.

Figure 9:
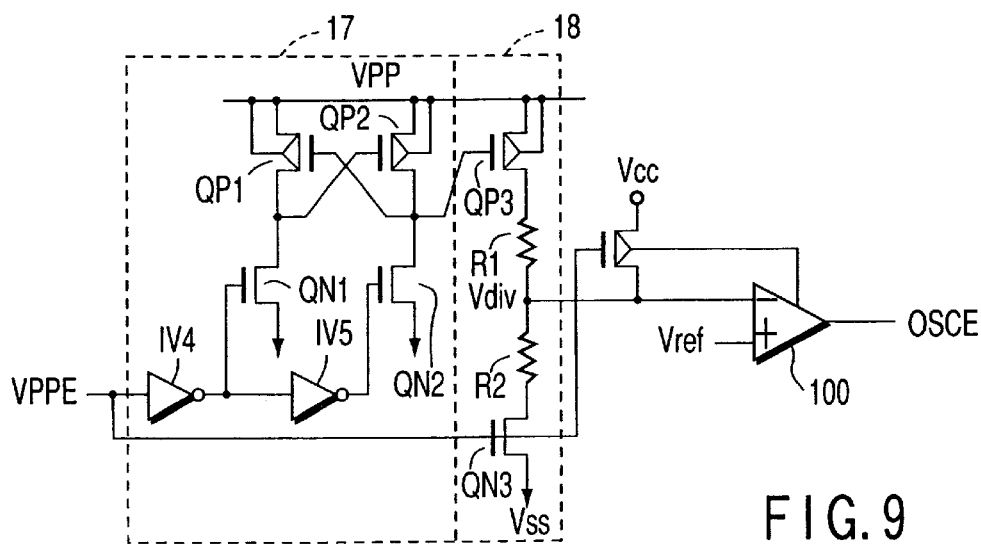
FIG. 9 exemplifies a construction of the detection circuit included in the circuit shown in FIG. 5.

The boost voltage generating circuit also comprises a voltage detection circuit (DETECT) 20. The voltage detection circuit DETECT 20 is supplied with the boosted voltage VPP so as to set the oscillation activation signal OSCE at "L" or "H" depending on the state as to whether the boosted voltage VPP is higher or lower than the reference value during the period "H" of the voltage boost activation signal VPPE. In this case, if the reference value is detected, the oscillation activation signal output OSCE is set at "L" so as to stop the operation of the ring oscillation circuit 19 and, thus, to stop the voltage boosting operation of each of the voltage boosting circuits 31 to 34. The voltage detection circuit DETECT 20 is constructed similar to the voltage detection circuit 16 described previously with reference to, for example, FIGS. 5 and 9.

If the voltage boost activation signal VPPE supplied to the voltage detection circuit 20 is set at "H" in the boost voltage generation circuit of the construction described above, the oscillation activation signal OSCE is set at "H" so as to operate the ring oscillation circuit 19 and, thus, to generate the phase shifted four clock signals CLKi. As a result, phase shifted four boost-driving clock signals DRVi are formed so as to allow the four voltage boosting circuits 31 to 34 to perform their voltage boosting functions, thereby obtaining the boosted voltage VPP. In this case, the voltage boosting operations of the four voltage boosting circuits 31 to 34 are controlled by the phase shifted boost-driving clock signals DRVi, with the result that the peak current of the entire system can be suppressed.

If the time when the boosted voltage VPP is higher than the reference value is detected in the period "H" of the voltage boost activation signal VPPE, the voltage detection circuit 20 sets the oscillation activation signal OSCE output at "L" so as to stop the operation of the ring oscillation circuit 19 and, at the same time, to hold the boost-driving clock signals DRVi at this time. As a result, the voltage boosting operations of the voltage boosting circuits 31 to 34 are stopped.

Figure 12A:
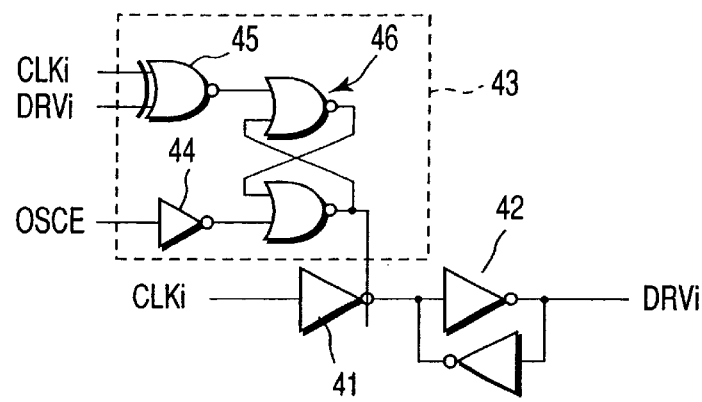
FIG. 12A exemplifies a circuit construction of one of the clock signal control circuits shown in FIG. 10.

FIG. 12A is a circuit diagram exemplifying the construction of one of the clock signal control circuits 21 to 24 shown in FIG. 10.

The clock signals CLKi supplied from a ring oscillation circuit, e.g., the circuit 19 shown in FIG. 10, are supplied to a clocked inverter 41 shown in FIG. 12A. The output signal of the clocked inverter 41 is supplied to a voltage boosting circuit, e.g., the circuits 31 to 34 shown in FIG. 10, through a latch circuit 42 consisting of two inverters connected in reversed parallel. As a result, the boost-driving clock signals DRVi are generated for each voltage boosting circuit.

A region 43 surrounded by a broken line in FIG. 12A represents a control circuit for performing the activation control of the clocked inverter 41. The control circuit 43 comprises an inverter 44 supplied with the oscillation activation signal OSCE, an exclusive NOR gate 45 supplied with the clock signals CLKi and the boost-driving clock signals DRVi, and a flip-flop circuit 46 with the reset input of the output of the inverter 44 and the set input of the output of the exclusive NOR gate 45. The set output of the flip-flop circuit 46 is supplied as the activation control signal of the clocked inverter 41.

Figure 12B:
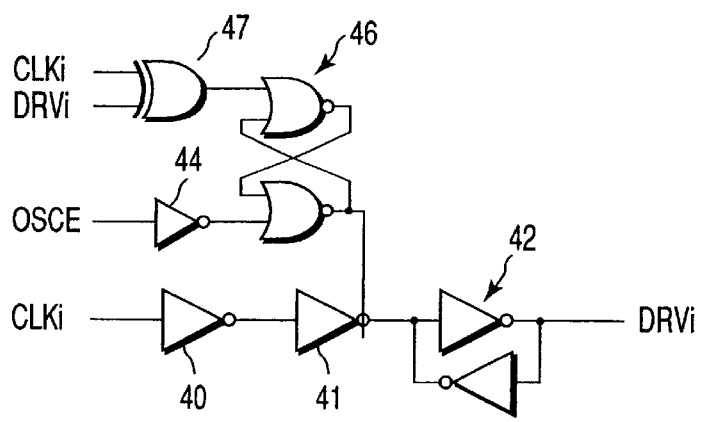
FIG. 12B shows another example of the circuit construction of one of the clock signal control circuits shown in FIG. 10.

FIG. 12B is a circuit diagram showing another example in respect of the construction of one of the clock control circuits 21 to 24 shown in FIG. 10.

The clock control circuit shown in FIG. 12B is similar to the clock control circuit shown in FIG. 12A, except that, in the clock control circuit shown in FIG. 12B, an odd number of inversion stages are arranged in the route between the clock signal CLKi input and the boost-driving clock signals DRVi. For example, the clock signals CLKi are supplied to the clocked inverter 41 through the inverter 40 in the clock control circuit shown in FIG. 12B. In this connection, an exclusive OR gate 47 is used in the clock control circuit shown in FIG. 12B in place of the exclusive NOR gate 45 used in the clock control circuit shown in FIG. 12A. Under the circumstances, those portions of the clock control circuit shown in FIG. 12B which correspond to the portions shown in FIG. 12A are denoted by the same reference numerals.

Figure 12C:
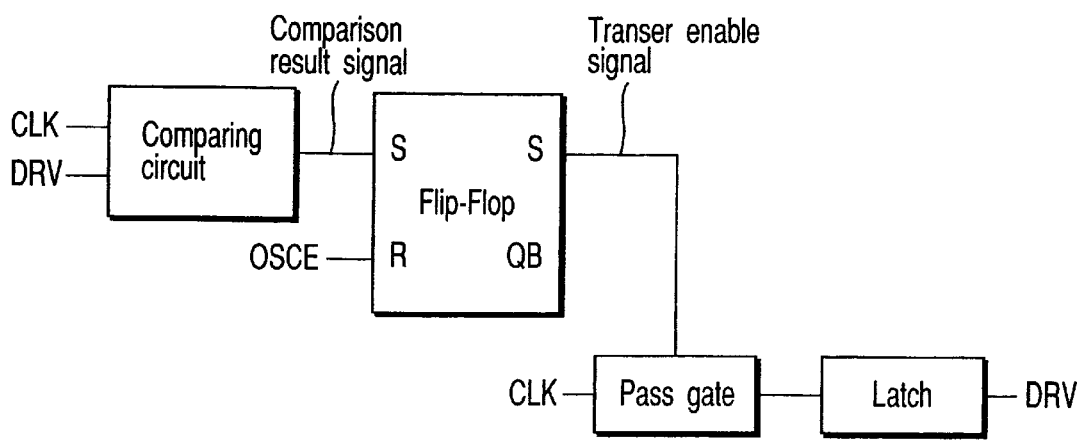
FIG. 12C exemplifies a block diagram of one of the clock signal control circuits shown in FIG. 10.

FIG. 12C is a block diagram showing an example in respect of the construction of one of the clock control circuits 21 to 24 shown in FIG. 10. The details of each block are shown in FIGS. 12A and 12B as described earlier.

FIG. 12D is a circuit diagram showing still another example in respect of the construction of one of the clock control circuits 21 to 24 shown in FIG. 10.

The clock control circuit shown in FIG. 12D is similar to the clock control circuit shown in FIG. 12A, except that, in the clock control circuit shown in FIG. 12D, the set output of the flip-flop circuit 46 is also supplied as the activation control signal to one of the two inverters connected in reversed parallel so as to form the latch circuit 42 to ensure the activation control operation.

FIG. 12E is a block diagram showing another example of the clock control circuits 21 to 24 shown in FIG. 10. The details of each block are shown in FIG. 12D and the modified circuit (not shown) of FIG. 12D including OR gate instead of NOR gate 45.

The operations of the circuit shown in FIG. 10 and the circuit shown for an example in FIG. 12A will now be described with reference to FIG. 11.

In the clock control circuit shown in FIG. 12A, the output of the inverter 44 is "L" and the set output of the flip-flop circuit 46 is "H", when the oscillation activation signal OSCE is "H", so as to activate the clocked inverter 41. As a result, the boost-driving clock signals DRVi are changed in accordance with the clock signals CLKi so as to allow the corresponding voltage boosting circuits 31 to 34 to perform their voltage boosting operations, thereby obtaining the boosted voltage VPP.

The voltage detection circuit 20 shown in FIG. 10 sets the oscillation activation signal OSCE at "L"/"H" in accordance with the state as to whether the boosted voltage is higher/lower than the level of the reference value. When the oscillation activation signal OSCE becomes "L", the output of the inverter 44 becomes "H" and the set output of the flip-flop circuit 46 becomes "L", with the result that the clocked inverter 41 is inactivated and, thus, the clock signal CLKi input is not transferred. As a result, the logic level of the boost-driving clock signals DRVi is held by the latch circuit 42 and, thus, the boost-driving clock signals DRVi cease to be changed so as to stop the voltage boosting operations of the voltage boosting circuits 31 to 34. It follows that, after the voltage detecting circuit 20 shown in FIG. 10 has detected the level of the reference value of the boosted voltage VPP, an unnecessary elevation of the boosted voltage VPP is not brought about.

Then, the boosted voltage VPP is gradually lowered by the detection resistance or the leakage current of the device. If the boosted voltage VPP is made lower than the level of the reference value, the oscillation activation signal OSCE becomes again "H". Then, if the logic level of the CLKi input reaches a predetermined logic level, the flip-flop circuit 46 is set so as to set the set output at "H" and activate again the clocked inverter 41, thereby turning on the route between the clock signals CLKi input and the boost-driving clock signals DRVi and, thus, starting again the voltage boosting operation.

If the voltage boosting operation is started again, the level of the boosted voltage VPP is recovered by the voltage boosting operations performed several times so as to set again the oscillation activation signal OSCE at "L". As a result, the route between the clock signals CLKi and the boost-driving clock signals DRVi is turned off again. In FIG. 11, the level of the boosted voltage is recovered by the voltage boosting operation in which the boost-driving clock signals DRVi are changed twice, i.e., the rise and the fall of the boost-driving clock signal DRV0, so as to diminish the overshoot of the boosted voltage VPP. It follows that it suffices for the overshoot of the boosted voltage VPP to be about ¼, though, in the prior art, the level of the boosted voltage is recovered in starting again the voltage boosting operation by the voltage boosting operation in which the boost-driving clock signals DRVi are changed about 8 times.

Incidentally, in starting again the voltage boosting operation as described above, it is desirable to select and set the activation timing of the clocked inverter 41 so as to prevent the logic level of the boost-driving clock signals DRVi of the held state from being changed when the clock signals CLKi input is transferred by the clocked inverter 41, thereby starting again the voltage boosting operation so as not to bring about an unnecessary elevation of the boosted voltage VPP and, thus, diminishing the dependence of the boosted voltage VPP on the power supply voltage Vcc.

The dependence of the boosted voltage VPP on the power supply voltage Vcc can be diminished by detecting the time when the logic level of the clock signal CLKi input has become coincident with the logic level of the boost-driving clock signals DRVi so as to set the flip-flop circuit 46 by the detection signal and to set the set output (activation signal of the clocked inverter 41) of the flip-flop circuit 46 at "H", if there are an even number of inversion stages in the route between the clock signal CLKi input and the boost-driving clock signals DRVi, as in the clock control circuit shown in FIG. 12A.

On the other hand, if there are an odd number of inversion stages in the route between the clock signals CLKi input and the boost-driving clock signals DRVi as in the clock control circuit shown in FIG. 12B, the time when the logic level of the clock signals CLKi input has failed to become coincident with the logic level of the boost-driving clock signals DRVi in the held state is detected so as to set the flip-flop circuit 46 by the detection signal and to set the set output (activation signal of the clocked inverter 41) of the flip-flop circuit 46 at "H".

Figure 1:
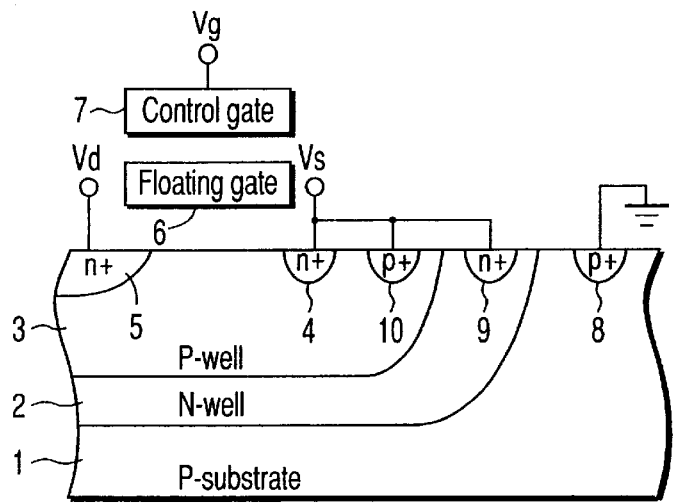
FIG. 1 is a cross sectional view showing the construction of one memory cell included in the conventional flash memory.
Figure 2:
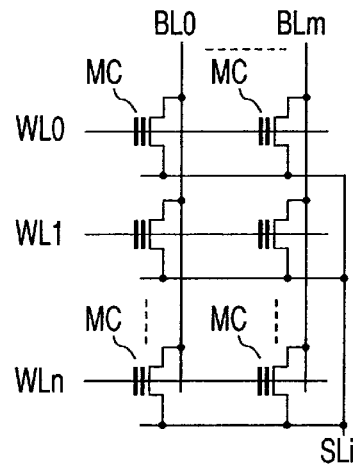
FIG. 2 is a circuit diagram exemplifying the memory cell array of the NOR-type flash memory.
Figure 3:
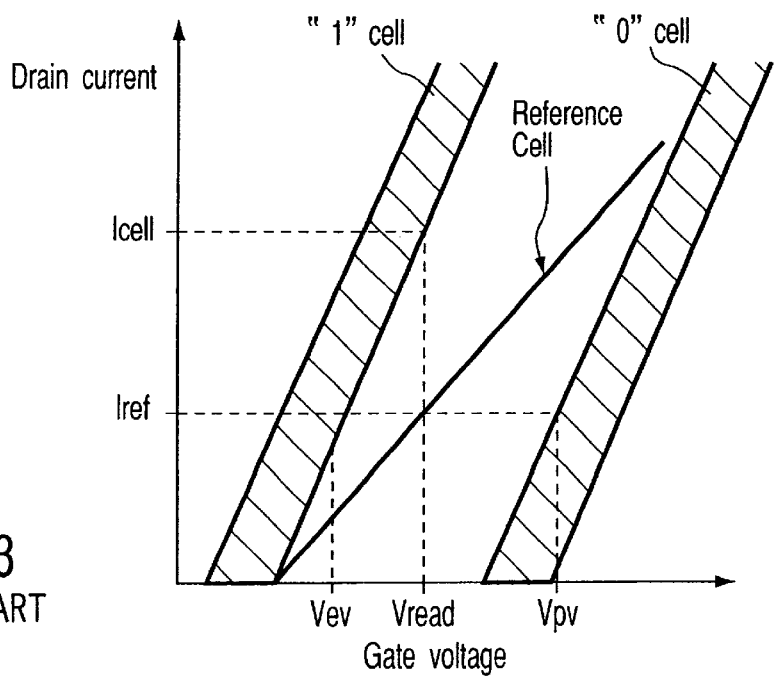
FIG. 3 is a graph showing the relationship between the gate voltage supplied to the control gate of the memory cell and the drain current flowing into the drain of the memory cell during operation of the flash memory.
Figures 4, 5:
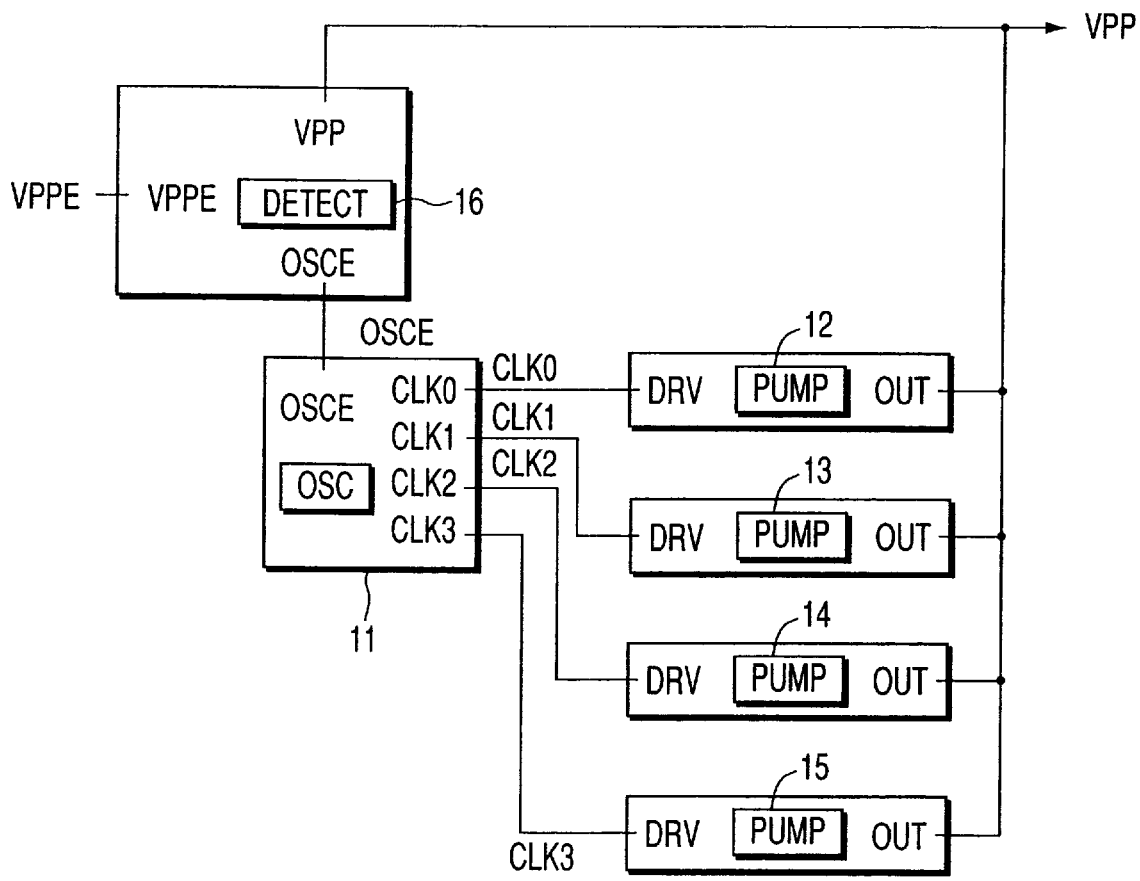
FIG. 4 is a table exemplifying the gate voltage Vg, the drain voltage Vd and the source voltage Vs supplied to the memory cell during operation of the flash memory.
FIG. 5 is a block diagram showing the system construction of the conventional boost voltage generating circuit.
Figure 8:
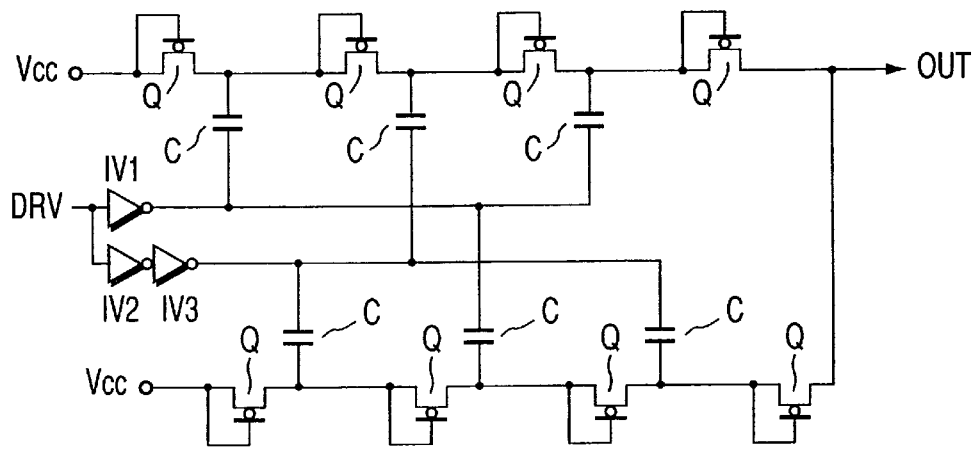
FIG. 8 exemplifies a construction of the voltage boosting circuit included in the circuit shown in FIG. 5.

Incidentally, the voltage boosting circuits 31 to 34 shown in FIG. 10 are constructed such that the charge pump circuits of two systems are boost-driven at the rising time and falling time of the boost-driving clock signals DRVi and the output signals are combined, like the voltage boosting circuits 12 to 15 shown in FIGS. 5 and 8. However, it is also possible to use a charge pump circuit of a single system that is boost-driven at the rising time of the boost-driving clock signals DRVi.

<Second Embodiment>

Figure 13:
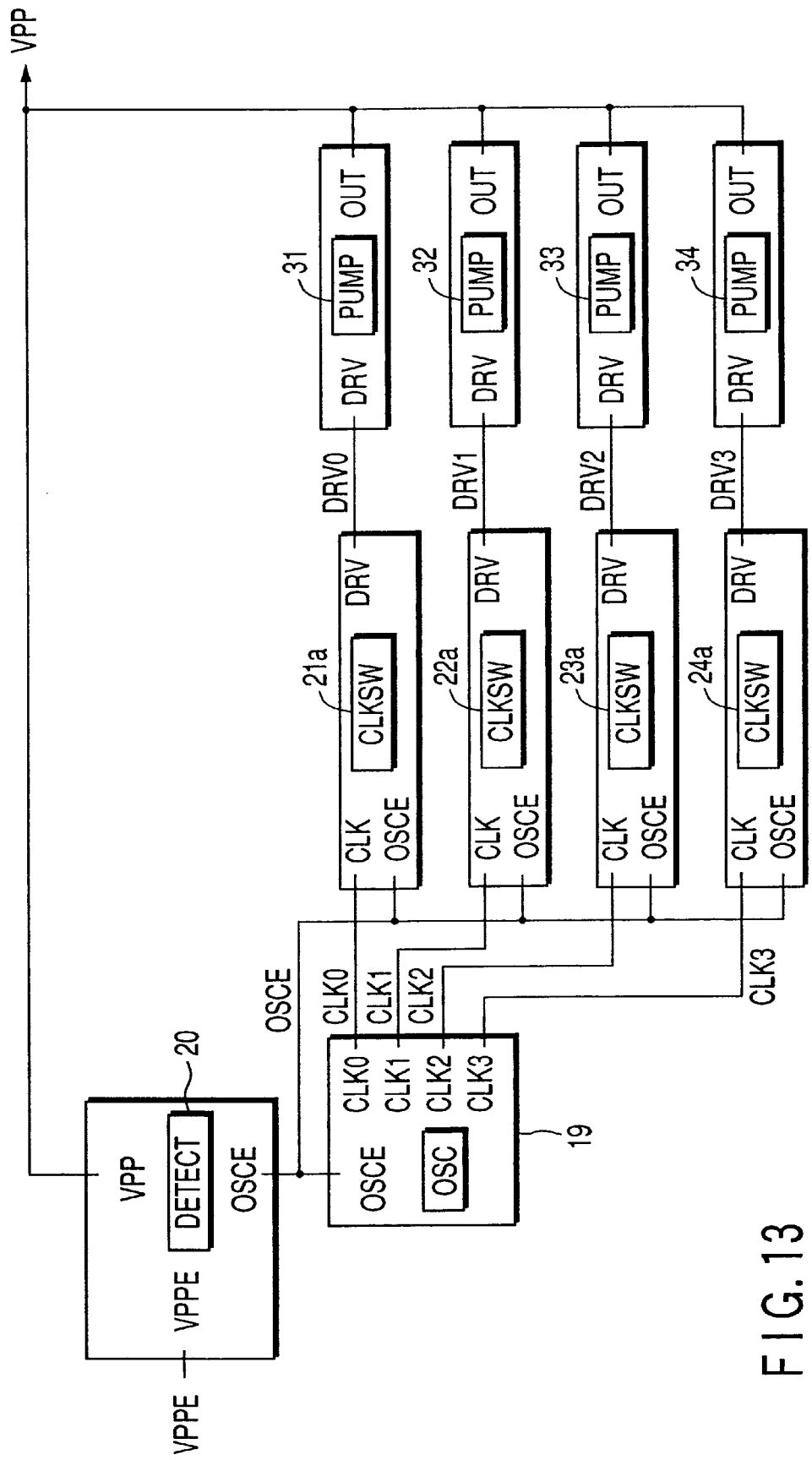
FIG. 13 is a block diagram showing the system construction of the boost voltage generating circuit of a semiconductor memory according to a second embodiment of the present invention.
Figure 14:
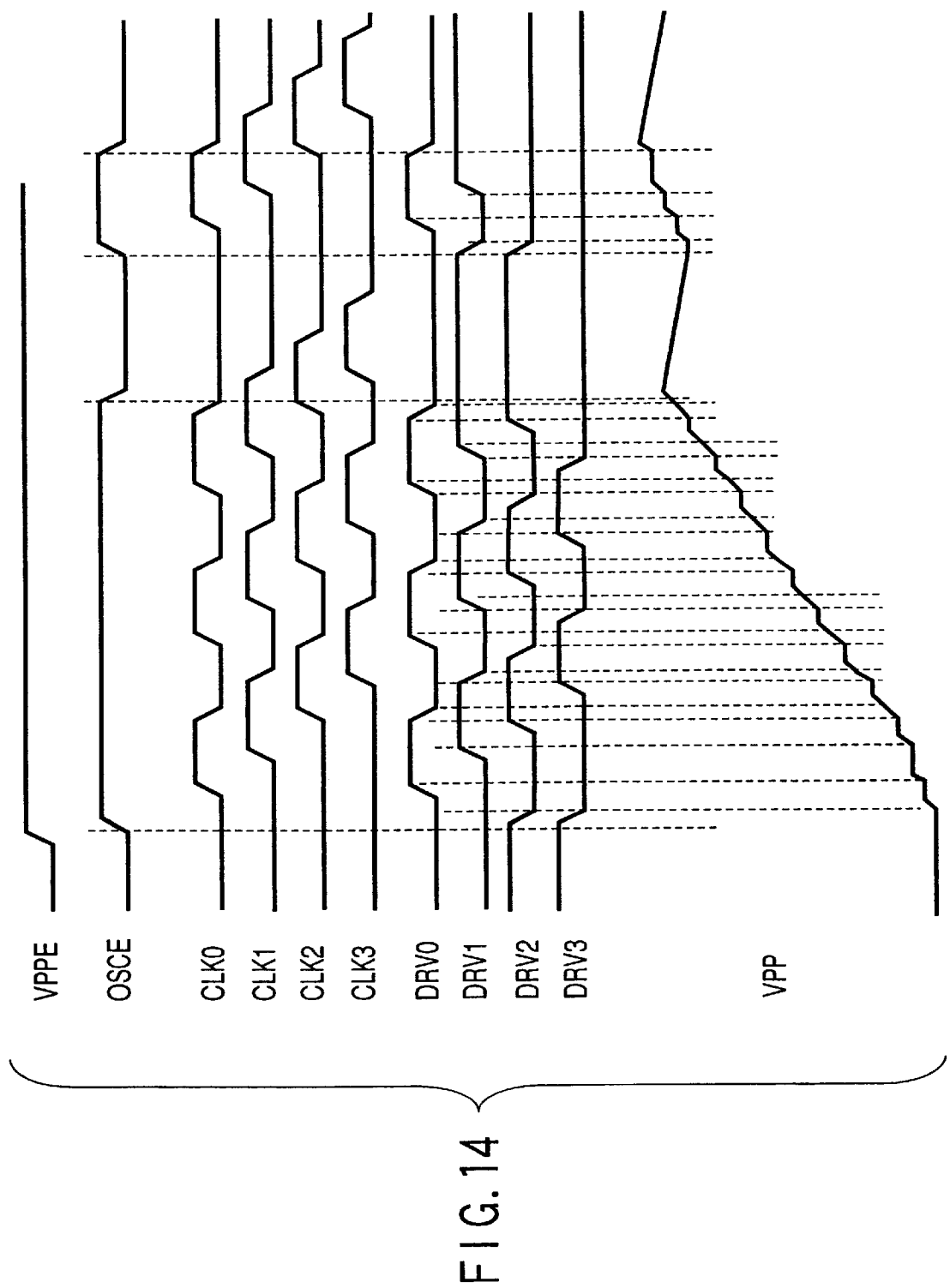
FIG. 14 shows the wave forms of the main signals and voltages for describing the operation of the circuit shown in FIG. 13.

FIG. 13 shows the system construction of a boost voltage generating circuit arranged in a semiconductor memory according to a second embodiment of the present invention, and FIG. 14 shows the wave forms of the main signals and the main voltages for describing the operation of the boost voltage generating circuit shown in FIG. 13.

The boost voltage generating circuit shown in FIG. 13 is substantially similar to the boost voltage generating circuit shown in FIG. 10, except that, in the circuit shown in FIG. 13, clock control circuits (CLKSW) 21a to 24a each having a simplified construction are used in place of the clock control circuit (DRVGEN) 21 to 24 shown in FIG. 10. Therefore, the same members of the circuit are denoted by the same reference numerals.

FIG. 15 is a circuit diagram showing as the representative one of the clock control circuits 21a to 24a shown in FIG. 13.

The clock control circuit shown in FIG. 15 differs from the clock control circuit described previously with reference to FIG. 12A in that the oscillation activation signal OSCE is used as the activation signal of the clocked inverter 41 and that the control circuit 43 shown in FIG. 12A is omitted in the clock control circuit shown in FIG. 15 so as to simplify the construction of the clock control circuit. The clock control circuits shown in FIGS. 15 and 12A are equal to each other in the other portion and, thus, the same members of the clock control circuit are denoted by the same reference numerals.

If the oscillation activation signal OSCE becomes "L" in the clock control circuit shown in FIG. 15, the boost-driving clock signals DRVi are held at that time so as not to transfer the clock signals CLKi input. Therefore, an unnecessary elevation of the boosted voltage VPP is not brought about after the voltage detection circuit 20 shown in FIG. 10 has detected the level of the reference value of the boosted voltage.

Then, the boosted voltage VPP is gradually lowered by the detection resistance and the leakage current of the device. When the boosted voltage VPP has been made lower than the level of the reference value so as to set again the oscillation activation signal OSCE at "H", the clocked inverter is immediately activated regardless of the logic level of the clock signal CLKi input so as to start again the voltage boosting operation.

It should be noted that, if the logic level of the clock signal CLKi input and the logic level of the boost-driving clock signals DRVi should have an inverted relationship, it is possible for the boost-driving clock signals DRVi to become "H" instantly when the oscillation activation signal OSCE has become "H". If the four voltage boosting circuits 31 to 34 shown in FIG. 13 are simultaneously activated so as to perform the voltage boosting operations, the peak current is increased. However, since the particular phenomenon takes place in a short period only at the time of starting again the voltage boosting operation, no inconvenience is brought about in the second embodiment in the case where the increase in the peak current for a short period does not give rise to a problem.

Incidentally, in the second embodiment of the present invention, if the voltage boosting operation is started again, the level of the boosted voltage VPP is recovered by the voltage boosting operations performed several times, with the result that, if the oscillation activation signal OSCE becomes "L" again, the route between the clock signals CLKi input and the boost-driving clock signals DRVi is turned off again. In the second embodiment of the present invention, the level of the boosted voltage VPP is recovered by the voltage boosting operation in which the change in the boost-driving clock signals DRVi takes place 5 times (at the rise and fall of the boost-driving clock signal DRV0, at the rise and fall of the boost-driving clock signal DRV1, and the at the rise of the boost-driving clock signal DRV2) so as to diminish the overshoot of the boosted voltage VPP. It follows that the overshoot of the boosted voltage VPP is lowered to about ⅝, though, in the prior art, the level of the boosted voltage is recovered in starting again the voltage boosting operation by the voltage boosting operation in which the boost-driving clock signals DRVi are changed about 8 times.

Incidentally, the boosted voltage generating circuit of the present invention can be applied to the read word line voltage, the write word line voltage, the write bit line voltage and the erase voltage generating circuit of a flash memory.

Figure 6:
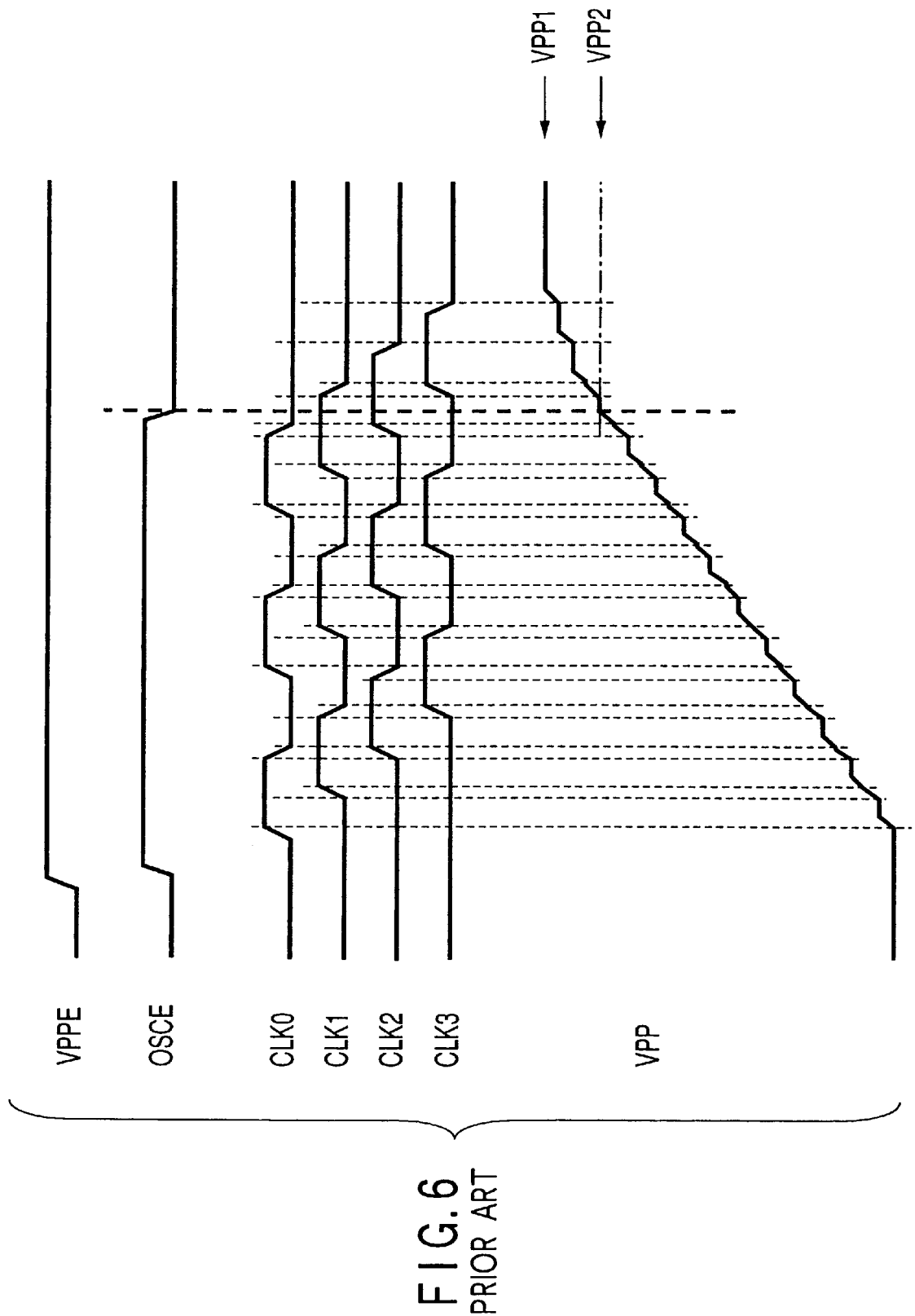
FIG. 6 shows the wave forms of the main signals and voltages for describing the operation of the circuit shown in FIG. 5.
Figure 16:
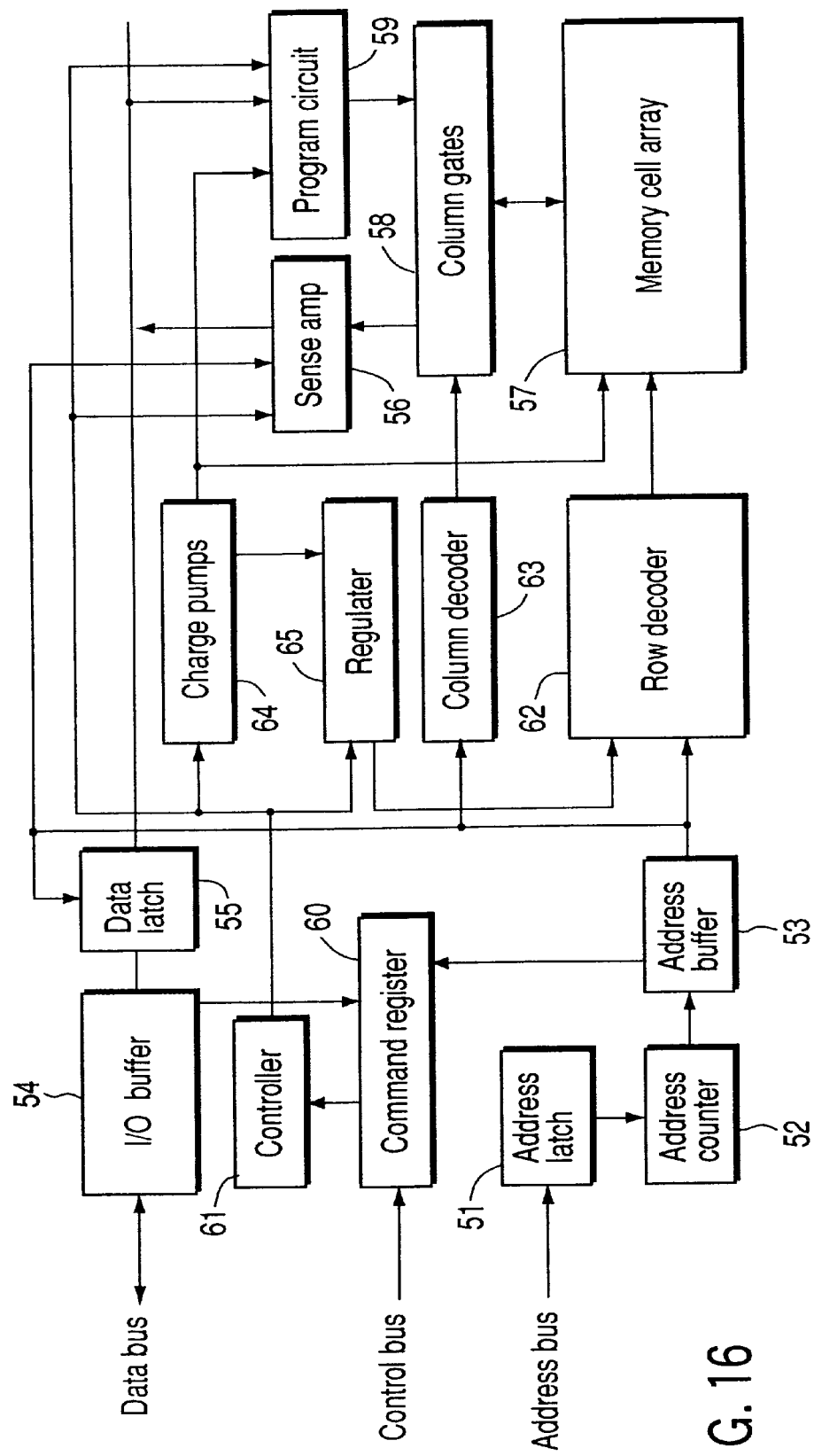
FIG. 16 is a block diagram schematically showing the entire construction of a flash memory to which is applied the technical idea of the present invention.

FIG. 16 is a block diagram schematically exemplifying the entire construction of a flash memory to which the present invention can be applied. The flash memory shown in FIG. 6 comprises an address latch 51, an address counter 52, an address buffer 53, an I/O buffer 54, a write program circuit 59, a command register 60, a controller 61, a row decoder 62, a column decoder 63, a column gate circuit 58, a memory cell array 57, a sense amplifier 56, a charge pump circuit 64, a program circuit 59, and a regulator circuit 65.

The address latch 51 is a circuit for receiving the address from an external address bus and latching the received address. The address counter 52 is a counter circuit for receiving the latch address of the address latch 51 and counting the received latch address. The address buffer 53 receives the output of the address counter so as to output an internal address corresponding to the memory cell that is to be read, written or erased.

The I/O buffer 54 permits the read data and the write data to be exchanged between the external data bus and the internal data latch 55. The sense amplifier 56 senses the data of the memory cell in the memory cell array 57 through the column gate circuit 58 in the reading time so as to output the sensed data of the memory cell to the data latch 55.

The program circuit 59 for write is supplied with write data supplied from the data latch 55 in the write operation time so as to supply a write voltage to the corresponding bit line of the memory cell array 57 through the column gate circuit 58.

The command register 60 holds the command such as the write or erase command supplied from the external control bus. The controller 61 receives the command held by the command register 60 so as to generate a control signal for controlling each circuit within the memory cell.

The row decoder 62 receives the inner address outputted from the address buffer 53 so as to select the corresponding word line of the memory cell array 57. The column decoder 63 receives the inner address outputted from the address buffer 53 so as to selectively drive the column gate of the column gate circuit 58 in accordance with the inner address. As a result, the selected bit line of the memory cell array 57 is connected to the sense amplifier 56 through the column gate circuit 58.

The charge pump circuit 64 boosts the external power supply voltage so as to generate a write voltage of 5V, and erase voltages of 10V (Vpp) and −7V. It is possible to apply the present invention to the boost voltage generating circuit including the charge pump circuit 64.

The write voltage of 5V generated from the charge pump circuit 64 is supplied to the program circuit 59. Also, the voltage of −7V is supplied to the memory cell array 57, and the voltage Vpp of 10V is supplied to the regulator circuit 65.

The regulator circuit 65 is capable of successively outputting in a time series fashion various voltages Vreg, which are supplied to the word line, i.e., the control gate of the memory cell, in the writing time or the reading time of the memory cell, from the voltage obtained in the single charge pump circuit 64. As a result, it is unnecessary to arrange many charge pump circuits in the flash memory so as to prevent the area of the entire chip from being enlarged. In addition, since a relatively large current flows through the charge pump circuit 64 and, thus, the consumed current is large, it is possible to decrease the consumed current of the entire chip by decreasing the number of charge pump circuits 64.

Incidentally, the voltage Vreg generated in the regulator circuit 65 is supplied to the word line of the memory cell array 57, i.e., the control gate of the memory cell, through the row decoder 62.

The boost voltage generating circuit of the present invention can be applied to not only the flash memory but also to the boost voltage generating circuit included in, for example, the other memory, the DRAM, the SRAM, the ferroelectric RAM, and the magnetic memory.

As described above, according to the semiconductor device of the present invention, whether to supply the clock signal generated from the oscillator as the boost-driving clock signal can be controlled directly by the output signal of the boosted voltage detection circuit so as to make it possible to prevent the voltage boosting operation until the operation of the oscillator is stopped after the boosted voltage has reached a set value. It follows that it is possible to control accurately the level of the boosted voltage.

Additional advantages and modifications will readily occur to those skilled in the art. Therefore, the present invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device, comprising:
    an oscillator configured to output a plurality of phase shifted clocks;
    a voltage boosting circuit configured to input a plurality of driving clocks and outputting a boosted voltage higher than a power supply voltage;
    a voltage detection circuit configured to detect whether said boosted voltage is higher than a predetermined voltage or not and to output a detection signal, wherein said detection signal is in a first logic state when said boosted voltage is lower than said predetermined voltage and said detection signal is in a second logic state when said boosted voltage is higher than said predetermined voltage; and
    a clock signal control circuit configured to input said plurality of phase shifted clocks and said detection signal, and to output said plurality of driving clocks, wherein said clock signal control circuit transfers said plurality of phase shifted clocks to output said plurality of driving clocks when said detection signal is in said first logic state, said clock signal control circuit stops transferring said plurality of phase shifted clocks when said detection signal changes from said first logic state to said second logic state, and said clock signal control circuit holds each logic state of said plurality of driving clocks when said detection signal is in said second logic state.

2. The semiconductor device according to claim 1, wherein said clock signal control circuit restarts transferring one of said plurality of phase shifted clocks to output the corresponding one of said plurality of driving clocks when a logic state of one of said plurality of phase shifted clocks is identical to said first or said second logic state of the corresponding one of said plurality of driving clocks after said detection signal transitions from said second logic state to said first logic state.

3. The semiconductor device according to claim 1, wherein said voltage boosting circuit generates a high voltage used for erasing, writing or reading data of memory cells.

4. The semiconductor device according to claim 1, wherein a logic state of one of said plurality of driving clocks is held when said clock signal control circuit restarts transferring the corresponding one of said plurality of phase shifted clocks to output said one of said plurality of driving clocks.

5. The semiconductor device according to claim 4, wherein said voltage boosting circuit generates a high voltage used in erasing, writing or reading data of memory cells.

6. The semiconductor device according to claim 4, wherein, an even number of inversion stages are arranged between the input and output terminals in said clock signal control circuit, and one of said plurality of phase shifted clocks is transferred when the logic state of said one of plurality of phase shifted clocks becomes the same as the logic state of the corresponding one of said plurality of driving clocks.

7. The semiconductor device according to claim 6, wherein said voltage boosting circuit generates a high voltage used in erasing, writing or reading data of memory cells.

8. The semiconductor device according to claim 4, wherein an odd number of inversion stages are arranged between the input and output terminals in said clock signal control circuit and one of said plurality of phase shifted clocks is transferred when the logic state of said one of plurality of phase shifted clocks becomes the inverted state of the logic state of the corresponding one of said plurality of driving clocks.

9. The semiconductor device according to claim 8, wherein said voltage boosting circuit generates a high voltage used in erasing, writing or reading data of memory cells.

10. The semiconductor device according to claim 1, wherein said clock signal control circuit comprises:
    a comparing circuit configured to compare one of said plurality of phase shifted clocks with the corresponding one of said plurality of driving clocks and outputting the comparison result signal;
    a flip-flop configured to latch a state, to input said comparison result signal as a set signal and said detection signal as a reset signal, and to output a transfer enable signal;
    a pass gate configured to input said transfer enable signal and said one of plurality of phase shifted clocks, and to transfer said one of plurality of phase shifted clocks depending on the state of said transfer enable signal; and
    a latch configured to latch the corresponding one of said plurality of driving clocks.

11. The semiconductor device according to claim 10, wherein said latch is configured to input said transfer enable signal.

12. The semiconductor device according to claim 1, wherein said clock signal control circuit comprises:
    a clocked inverter supplied with one of said plurality of phase shifted clocks of said oscillator;
    a latch circuit connected to the output portion of said clocked inverter and including two inverters connected in reversed parallel and outputting driving clocks; and
    a first control circuit of said clocked inverter configured to perform the activation control of said clocked inverter, said first control circuit including:
        an inverter supplied with an oscillation activation signal;
        an exclusive NOR gate supplied with said driving clocks and said oscillation activation signal;
        a flip-flop circuit having the output portion of the inverter supplied with said oscillation activation signal connected to the reset input terminal and having the output portion of said exclusive NOR gate connected to the set input terminal; and a second control circuit of said clocked inverter having the set output terminal of said flip-flop circuit connected to the control terminal performing the activation control of said clocked inverter.

13. The semiconductor device according to claim 12, wherein one of said two inverters connected in reversed parallel is a clocked inverter having the control terminal performing the activation control of said latch circuit and said clocked inverter being configured to input one of said plurality of phase shifted clocks.

14. The semiconductor device according to claim 12, wherein said oscillator is formed of a ring oscillator.

15. The semiconductor device according to claim 1, wherein said clock signal control circuit comprises:
  a clocked inverter supplied with one of said plurality of phase shifted clocks of said oscillator through an inverter;
  a latch circuit connected to the output portion of said clocked inverter and including two inverters connected in reversed parallel and outputting driving clocks; and
  a first control circuit of said clocked inverter configured to perform the activation control of said clocked inverter, said first control circuit including:
    an inverter supplied with an oscillation activation signal;
    an exclusive OR gate supplied with said driving clocks and said oscillation activation signal;
    a flip-flop circuit having the output portion of the inverter supplied with said oscillation activation signal connected to the reset input terminal and having the output portion of said exclusive OR gate connected to the set input terminal; and
    a second control circuit of said clocked inverter having the set output terminal of said flip-flop circuit connected to the control terminal performing the activation control of said clocked inverter.

16. The semiconductor device according to claim 15, wherein one of said two inverters connected in reversed parallel is a clocked inverter having the control terminal performing the activation control of said latch circuit and said clocked inverter being configured to input one of said plurality of phase shifted clocks.

17. The semiconductor device according to claim 16, wherein said oscillator is formed of a ring oscillation circuit.

18. The semiconductor device according to claim 1, wherein said clock signal control circuit comprises:
  a clocked inverter supplied with one of said plurality of phase shifted clocks of said oscillator; and
  a latch circuit connected to the output portion of said clocked inverter and including two inverters connected in reversed parallel and outputting driving clock signals,
  wherein the activation control of said clocked inverter is performed by inputting an oscillation activation signal to the control terminal of said clocked inverter.

19. The semiconductor device according to claim 18, wherein said oscillator is formed of a ring oscillation circuit.

20. A semiconductor device comprising:
  an oscillator configured to output N phase shifted clocks, wherein N is an integer larger than one;
  M voltage boosting circuits each configured to receive one of M driving clocks and to output a boosted voltage higher than a power supply voltage, wherein M is an integer larger than one and not larger than N;
  a voltage detection circuit to which output nodes of L of the M voltage boosting circuits are connected, wherein L is an integer larger than one and not larger than M, the voltage detection circuit configured to detect whether said boosted voltage is higher than a predetermined voltage or not and to output a detection signal, wherein said detection signal is in a first logic state when said boosted voltage is lower than said predetermined voltage and said detection signal is in a second logic state when said boosted voltage is higher than said predetermined voltage; and
  N clock signal control circuits configured to receive said detection signal and said N phase shifted clocks and to output said M driving clocks, wherein said clock signal control circuits amplify M of said N phase shifted clocks and to output said M driving clocks when said detection signal is in said first logic state, said clock signal control circuit stops amplifying said M phase shifted clocks when said detection signal changes from said first logic state to said second logic state, and said N clock signal control circuits hold logic states of said M driving clocks when said detection signal is in said second logic state.

21. The semiconductor device according to claim 20, wherein an m-th clock signal control circuit restarts amplifying an m-th phase shifted clock to output an m-th driving clock when a logic state of said m-th phase shifted clock is identical to a logic state of said m-th driving clock after said detection signal changes from said second logic state to said first logic state, wherein m is any integer larger than one and not larger than M.

22. The semiconductor device according to claim 20, wherein each of said M voltage boosting circuits generates a high voltage used for erasing, writing or reading data of memory cells.

23. The semiconductor device according to claim 20, wherein a logic state of an m-th driving clock is held when an m-th clock signal control circuit stops amplifying an m-th phase shifted clock to output said m-th M driving clock.

24. The semiconductor device according to claim 23, wherein each of said M voltage boosting circuits generates a high voltage used for erasing, writing or reading data of memory cells.

25. The semiconductor device according to claim 23, wherein an odd number of inversion stages are arranged between input and output terminals of each of said clock signal control circuits, and said m-th phase shifted clock is amplified when a logic state of said m-th phase shifted clocks becomes the inverted stage of a logic state of said m-th driving clock.

26. The semiconductor device according to claim 23, wherein an even number of inversion stages are arranged between input and output terminals of each of said clock signal control circuits, and said m-th phase shifted clock is amplified when a logic state of said m-th shifted clock becomes the same as a logic state of said m-th driving clock.

27. The semiconductor device according to claim 26, wherein each of said M voltage boosting circuits generates a high voltage used for erasing, writing or reading data of memory cells.

28. The semiconductor device according to claim 26, herein each of said M voltage boosting circuits generates a high voltage used for erasing, writing or reading data of memory cells.

29. The semiconductor device according to claim 20, wherein said clock signal control circuit comprises:
  a comparing circuit configured to compare an m-th phase shifted clock with an m-th driving clock and outputting the comparison result signal, wherein m is any integer larger than lone and not larger than M;

a flip-flop configured to latch a state, to input said comparison result signal as a set signal and said detection signal as a reset signal, and to output a transfer enable signal;

a pass gate configured to input said transfer enable signal and said m-th phase shifted clock, and to transfer said m-th phase shifted clock depending on the state of said transfer enable signal; and a latch configured to latch said m-th driving clock.

30. The semiconductor device according to claim 29, wherein said latch is configured to input said transfer enable signal.

31. The semiconductor device according to claim 20, wherein said clock signal control circuit comprises:

a clocked inverter supplied with an m-th phase shifted clock of said oscillator, wherein m is any integer larger than one and not larger than M;

a latch circuit connected to the output portion of said clocked inverter and including two inverters connected in reversed parallel and outputting driving clocks; and a first control circuit of said clocked inverter configured to perform the activation control of said docked inverter, said first control circuit including:

an inverter supplied with an oscillation activation signal;

an exclusive NOR gate supplied with said driving clocks and said oscillation activation signal;

a flip-flop circuit having the output portion of the inverter supplied with said oscillation activation signal connected to the reset input terminal and having the output portion of said exclusive NOR gate connected to the set input terminal; and a second control circuit of said clocked inverter having the set output terminal of said flip-flop circuit connected to the control terminal performing the activation control of said clocked inverter.

32. The semiconductor device according to claim 31, wherein one of said two inverters connected in reversed parallel is a clocked inverter baying the control terminal performing the activation control of said latch circuit and said clocked inverter being configured to input an m-th phase shifted clock.

33. The semiconductor device according to claim 31, wherein said oscillator is formed of a ring oscillator.

34. The semiconductor device according to claim 20, wherein said clock signal control circuit comprises:

a clocked inverter supplied with an m-th phase shifted clocks of said oscillator through an inverter, wherein m is any integer larger than one and not larger than M;

a latch circuit connected to the output portion of said clocked inverter and including two inverters connected in reversed parallel and outputting driving clocks; and a first control circuit of said clocked inverter configured to perform the activation control of said clocked inverter, said first control circuit including:

an inverter supplied with an oscillation activation signal;

an exclusive OR gate supplied with said driving clocks and said oscillation activation signal;

a flip-flop circuit having the output portion of the inverter supplied with said oscillation activation signal connected to the reset input terminal and having the output portion of said exclusive OR gate connected to the set input terminal; and a second control circuit of said clocked inverter having the set output terminal of said flip-flop circuit connected to the control terminal performing the activation control of said clocked inverter.

35. The semiconductor device according to claim 34 wherein one of said two inverters connected in reversed parallel is a clocked inverter having the control terminal performing the activation control of said latch circuit and said clocked inverter being configured to input an m-th phase shifted clock.

36. The semiconductor device according to claim 34, wherein said oscillator is formed of a ring oscillator.

37. The semiconductor device according to claim 20, wherein said clock signal control circuit comprises:

a clocked inverter supplied with an m-th phase shifted clock of said oscillator, wherein m is any integer larger than one and not larger than M;

a latch circuit connected to the output portion of said clocked inverter and including two inverters connected in reversed parallel and outputting driving clocks, wherein the activation control of said clocked inverter is performed by inputting an oscillation activation signal to the control terminal of said clocked inverter.

38. The semiconductor device according to claim 37 wherein said oscillator is formed of a ring oscillation circuit.

* * * * *

UNITED STATES PATENT AND TRADEMARK OFFICE
CERTIFICATE OF CORRECTION

PATENT NO. : 6,567,309 B2  
DATED : May 20, 2003  
INVENTOR(S) : Toru Tanzawa

It is certified that error appears in the above-identified patent and that said Letters Patent is hereby corrected as shown below:

Column 15,
Line 43, "16" has been replaced with -- 15 --;

Column 16,
Line 67, "lone" has been replaced with -- one --;

Column 17,
Line 22, "docked" has been replaced with -- clocked --;
Line 40, "baying" has been replaced with -- having --.

Signed and Sealed this

Sixteenth Day of December, 2003

JAMES E. ROGAN
*Director of the United States Patent and Trademark Office*